(12) United States Patent
Chen et al.

(10) Patent No.: US 11,799,001 B2
(45) Date of Patent: Oct. 24, 2023

(54) BACK-END-OF-LINE DEVICES

(71) Applicant: Taiwan Semiconductor Manufacturing Company, Ltd., Hsinchu (TW)

(72) Inventors: Yu-Hsiang Chen, Hsinchu (TW); Po-Hsiang Huang, Taipei (TW); Wen-Sheh Huang, Hsin Chu (TW); Hsing-Leo Tsai, Hsinchu (TW); Chia-En Huang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/327,341

(22) Filed: May 21, 2021

(65) Prior Publication Data
US 2022/0293749 A1    Sep. 15, 2022

Related U.S. Application Data

(60) Provisional application No. 63/158,459, filed on Mar. 9, 2021.

(51) Int. Cl.
| | | |
|---|---|---|
| *H01L 29/41* | (2006.01) | |
| *H01L 29/417* | (2006.01) | |
| *H01L 21/48* | (2006.01) | |
| *H01L 23/522* | (2006.01) | |

(52) U.S. Cl.
CPC ...... *H01L 29/41725* (2013.01); *H01L 21/486* (2013.01); *H01L 23/5226* (2013.01)

(58) Field of Classification Search
CPC ............. H01L 29/41725; H01L 21/486; H01L 23/5226; H01L 27/11206; H01L 23/5252; H01L 21/823475; G11C 17/165

USPC ........................................................ 257/288
See application file for complete search history.

(56) References Cited

U.S. PATENT DOCUMENTS

| | | | |
|---|---|---|---|
| 6,740,392 B1 | 5/2004 | Farrar | |
| 8,791,024 B1* | 7/2014 | Lu ...................... | H01L 21/0274 257/E21.492 |
| 9,735,151 B1* | 8/2017 | Apodaca ............ | H01L 23/5226 |
| 10,361,119 B1* | 7/2019 | Motoyama ........ | H01L 21/76879 |

(Continued)

FOREIGN PATENT DOCUMENTS

| | | |
|---|---|---|
| CN | 102272916 A | 12/2011 |
| KR | 20060011885 A | 2/2006 |

(Continued)

OTHER PUBLICATIONS

Hsin-Wen Su et al, Memory Structure with Doping-Induced Leakage Paths, U.S. Appl. No. 17/007,806, filed Aug. 31, 2020, Assignee: Taiwan Semiconductor Manufacturing Co. Ltd., 22 pages of specification, 8 pages drawings.

*Primary Examiner* — Sheikh Maruf
(74) *Attorney, Agent, or Firm* — HAYNES AND BOONE, LLP

(57) ABSTRACT

A transistor and an interconnect structure disposed over the transistor. The interconnect structure includes a first dielectric layer, a first conductive feature in the first dielectric layer, a first etch stop layer (ESL) disposed over the first dielectric layer and the first conductive feature, a dielectric feature disposed in the first ESL, an electrode disposed over the dielectric feature, and a second ESL disposed on the first ESL and the electrode.

20 Claims, 16 Drawing Sheets

(56) References Cited

U.S. PATENT DOCUMENTS

| | | | |
|---|---|---|---|
| 10,636,804 B1* | 4/2020 | Reznicek | H01L 29/66825 |
| 2007/0007621 A1 | 1/2007 | Omura | |
| 2007/0040276 A1 | 2/2007 | Yang et al. | |
| 2008/0145796 A1* | 6/2008 | Chen | G03F 7/095 |
| | | | 430/322 |
| 2008/0251877 A1* | 10/2008 | Jain | B81C 1/0015 |
| | | | 257/E21.328 |
| 2009/0239375 A1* | 9/2009 | Riess | H01L 23/5226 |
| | | | 438/689 |
| 2011/0159253 A1* | 6/2011 | Kang | G03F 7/203 |
| | | | 430/323 |
| 2012/0104622 A1* | 5/2012 | Kim | H01L 23/53295 |
| | | | 257/774 |
| 2013/0157462 A1* | 6/2013 | Lee | H01L 21/3086 |
| | | | 438/694 |
| 2013/0234294 A1* | 9/2013 | Hu | H01L 23/53295 |
| | | | 430/312 |
| 2014/0001568 A1 | 1/2014 | Wang | |
| 2014/0239501 A1* | 8/2014 | Tsai | H01L 23/53233 |
| | | | 438/653 |
| 2014/0342272 A1* | 11/2014 | Lu | G03F 7/20 |
| | | | 430/296 |
| 2014/0342564 A1* | 11/2014 | Lu | G03F 1/20 |
| | | | 430/296 |
| 2015/0048516 A1 | 2/2015 | Lu et al. | |
| 2015/0200130 A1* | 7/2015 | Huang | H01L 21/76808 |
| | | | 438/618 |
| 2015/0221656 A1 | 8/2015 | Yang | |
| 2015/0279729 A1* | 10/2015 | Chang | H01L 23/5226 |
| | | | 257/288 |
| 2015/0287596 A1* | 10/2015 | Lu | G03F 7/2022 |
| | | | 716/55 |
| 2016/0118336 A1* | 4/2016 | Yang | H01L 23/485 |
| | | | 257/288 |
| 2016/0190124 A1* | 6/2016 | Lee | H01L 27/088 |
| | | | 438/197 |
| 2017/0045827 A1* | 2/2017 | Lu | G03F 7/70558 |
| 2017/0110366 A1* | 4/2017 | Lu | H01L 21/0332 |
| 2017/0194253 A1 | 7/2017 | Wang et al. | |
| 2017/0278742 A1 | 9/2017 | Chen et al. | |
| 2019/0304894 A1 | 10/2019 | Dorgan | |
| 2020/0035691 A1* | 1/2020 | Reznicek | H01L 29/105 |
| 2020/0091288 A1* | 3/2020 | Lee | H01L 29/6656 |
| 2020/0135747 A1* | 4/2020 | Reznicek | H01L 21/823431 |
| 2020/0259013 A1* | 8/2020 | Reznicek | H01L 29/7827 |

FOREIGN PATENT DOCUMENTS

| | | |
|---|---|---|
| KR | 20150020053 A | 2/2015 |
| KR | 20170081552 A | 7/2017 |
| WO | 2004114396 A1 | 12/2004 |

* cited by examiner

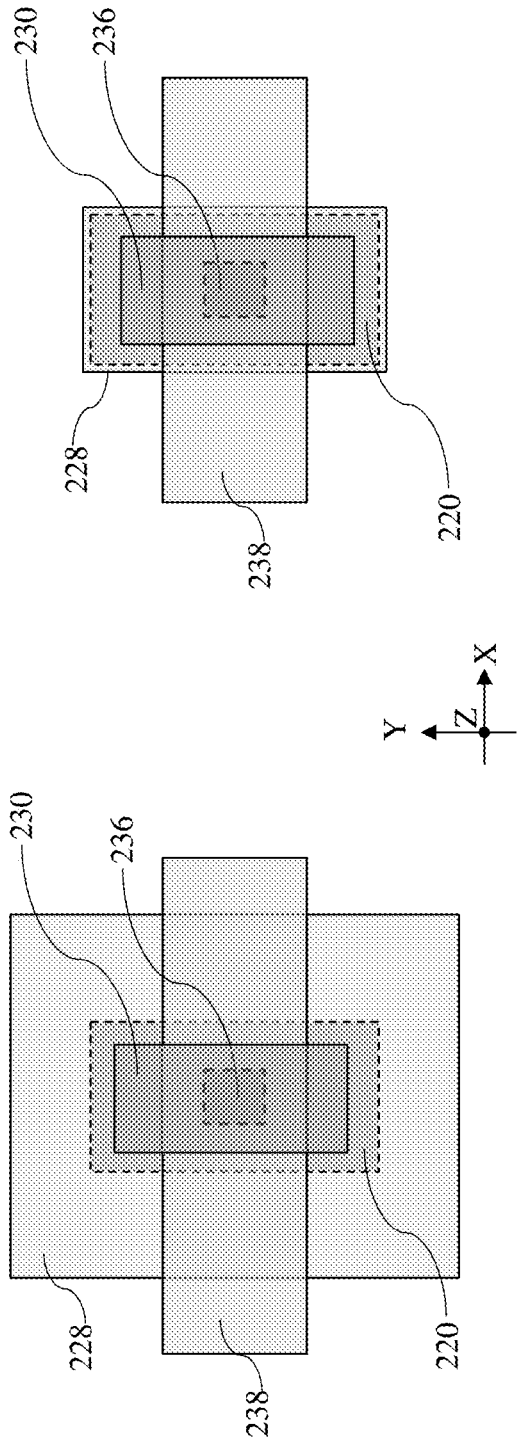

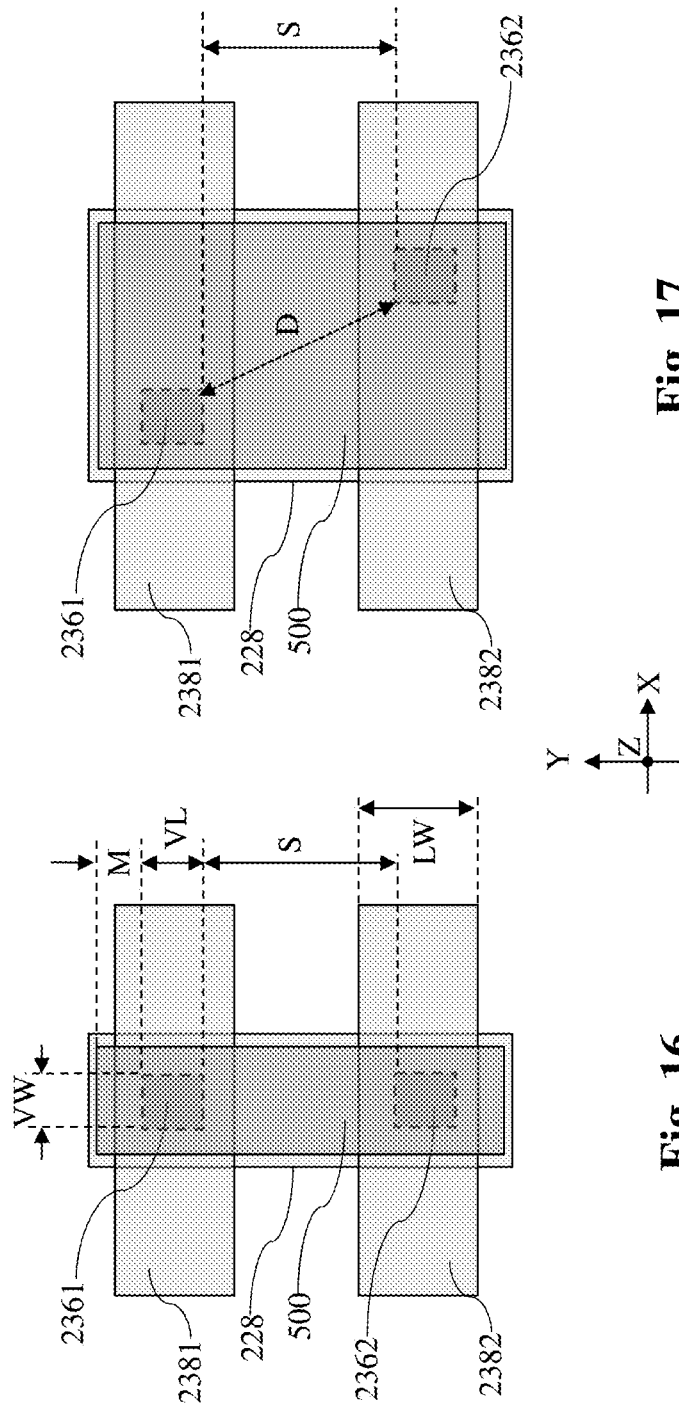

BACK-END-OF-LINE DEVICES

PRIORITY DATA

This application is a non-provisional application of U.S. Provisional Patent Application Ser. No. 63/158,459, entitled "ONE-TIME MEMORY STRUCTURE" and filed Mar. 9, 2021, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

The ever-smaller dimensions introduce hurdles in formation of high voltage devices, such as one-time-programmable (OTP) memory. The larger size of high voltage devices may cause topography issues and may compress room for other features. The higher operating voltage of the high voltage devices may break down gate oxide layers, leading to unintentional activation of devices. Therefore, while OTP memory structures are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIGS. 11-13 illustrate diagrammatic top layout views of a one-time-programmable (OTP) memory device fabricated using the method of FIG. 1, according to various aspects of the present disclosure.

FIGS. 16-19 illustrate diagrammatic top layout views of a high-resistance (Hi-R) device or high-resistance (Hi-R) resistor fabricated using the method of FIG. 1, according to various aspects of the present disclosure.

DETAILED DESCRIPTION

Figure 1:
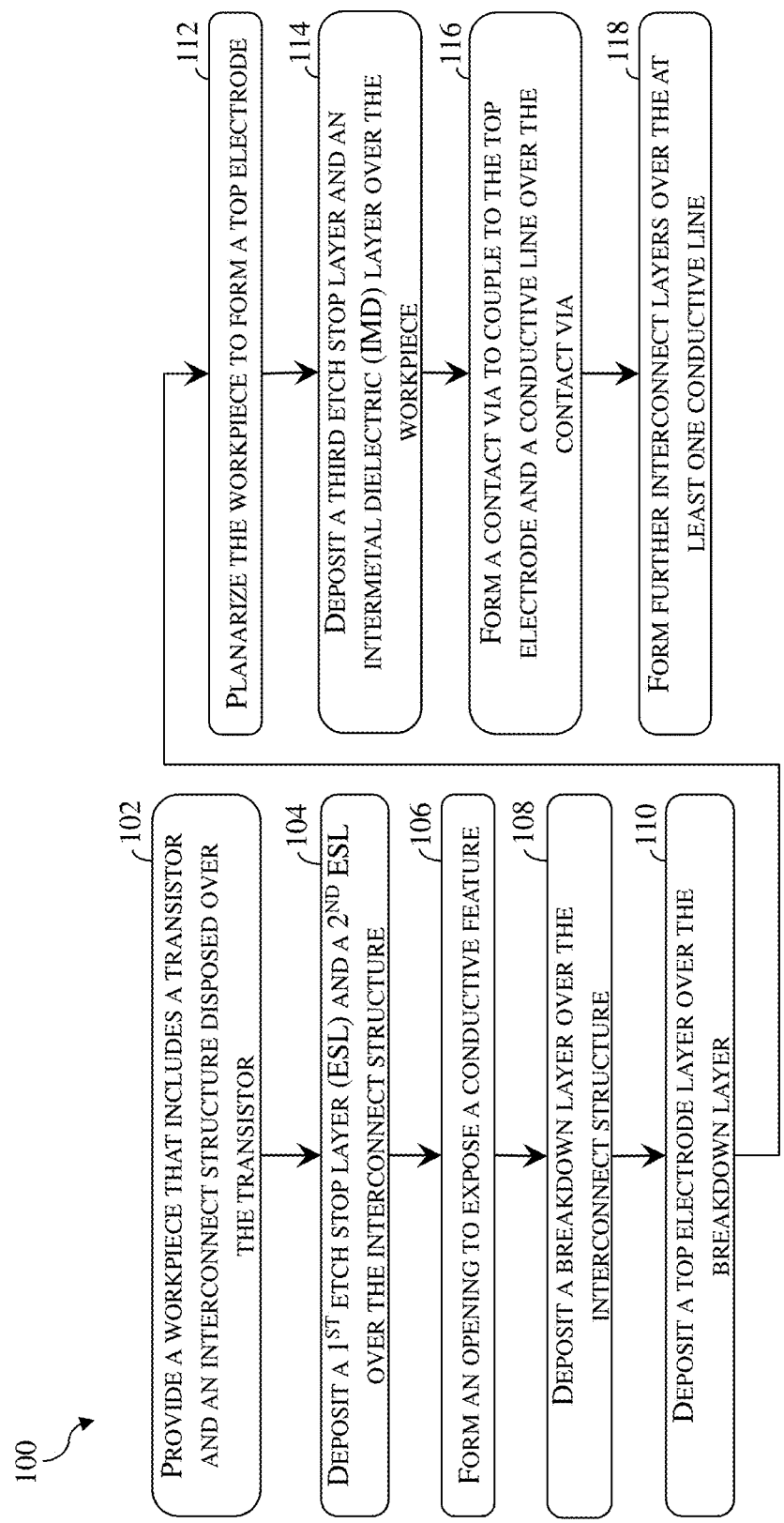
FIG. 1 is a flowchart illustrating a method of fabricating a semiconductor structure according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Semiconductor storage elements may be generally divided into two types—volatile memory devices and non-volatile memory devices. A volatile memory device loses stored information when the power is removed from the circuit. On the contrary, a non-volatile memory device retains stored information even after the power is removed. Non-volatile memory device may be further divided into two sub-categories. Multiple-time programmable (MTP) memory devices allow multiple programming operations. One-time programmable (OTP) memory devices allow only one non-reversible programming operation. In some existing technologies, OTP memory devices may be formed using transistor structures formed in front-end-of-line (FEOL) process. In those existing technologies, the gate dielectric layer may serve as a fuse element or programming element. However, when semiconductor devices continue to shrink in dimensions, it may become challenging to form OTP memory devices using transistor structures and still maintain satisfactory high-voltage endurance or reliability.

The present disclosure provides methods to form an OTP memory device in an interconnect structure formed in back-end of-line (BEOL) processes along with high-resistance (Hi-R) resistors. The OTP memory devices of the present disclosure include a metal-insulator-metal (MIM) construction and a U-shaped breakdown layer surrounding a top electrode feature. According to the present disclosure, forming the OTP memory devices and Hi-R resistors in the BEOL structure may reduce circuit area and may reduce production cost associated with photolithography masks.

The various aspects of the present disclosure will now be described in more detail with reference to the figures. In that regard, FIG. 1 is a flowchart illustrating method 100 of forming a semiconductor structure according to embodiments of the present disclosure. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. Method 100 is described below in conjunction with FIGS. 2-9, which are fragmentary cross-sectional views of a workpiece 200 at different stages of fabrication according to embodiments of method 100. Because the workpiece 200 will be fabricated into a semiconductor structure or a semiconductor device at the conclusion of the fabrication processes, the workpiece 200 may also be referred to as a semiconductor structure 200 or a semiconductor device 200 as the context requires. Additionally, throughout the present application, like reference numerals denote like features, unless otherwise excepted.

Figure 2:
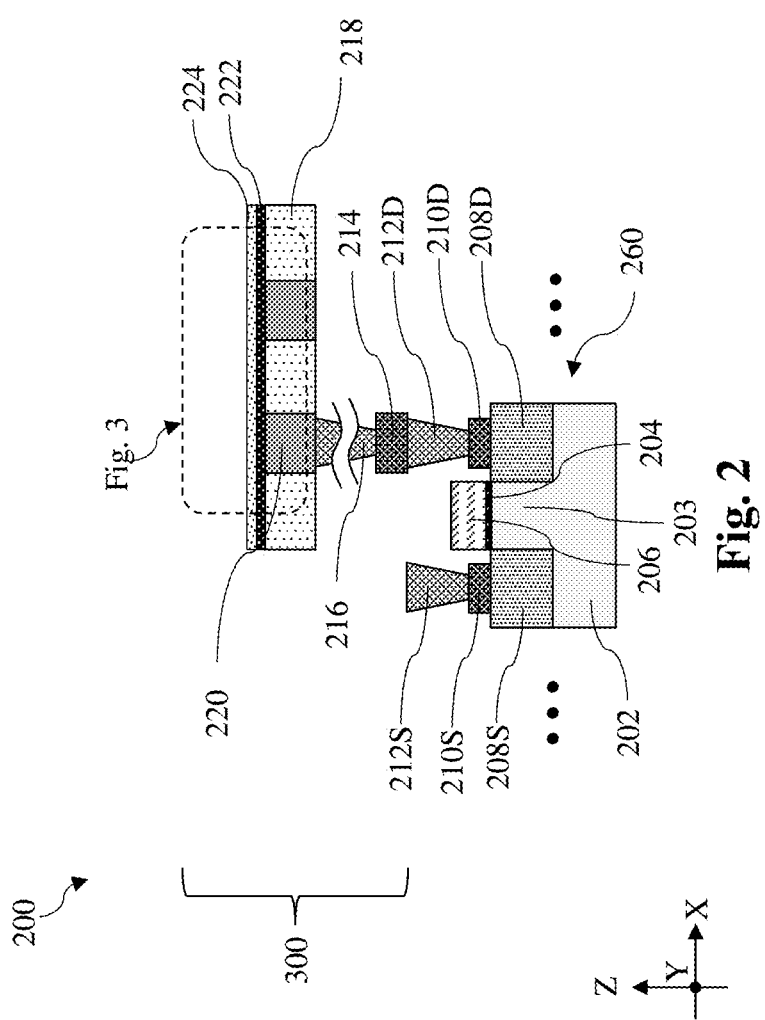
FIGS. 2-9 illustrate diagrammatic fragmentary cross-sectional views of a workpiece undergoing various stages of fabrication according to the method of FIG. 1, according to various aspects of the present disclosure.

Referring to FIGS. 1 and 2, method 100 includes a block 102 where a workpiece 200 is received. As shown in FIG. 2, the workpiece 200 may include a substrate 202 and an interconnect structure 300 disposed over the substrate 202. The substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure.

The workpiece 200 further includes a transistor 260 formed on the substrate 202. The transistor 260 may be a multi-gate device, such as a fin-like field effect transistor (FinFET) or a multi-bridge-channel (MBC) transistor. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may take form of nanowires, nanosheets, or other nanostructures and for that reasons, an MBC transistor may also be referred to as a nanowire transistor or a nanosheet transistor. As shown in FIG. 2, the transistor 260 includes a source feature 208S, a drain feature 208D, an active region 203 disposed between the source feature 208S and the drain feature 208D, a gate dielectric layer 204 disposed over the active region 203, and a gate electrode 206 disposed over the gate dielectric layer 204. Depending on the type of the transistor 260, the active region 203 may have a fin-like shape or may have a plurality of channel members extending between the source feature 208S and the drain feature 208D. Detailed structures of the active region 203 may not be explicitly shown in the figures.

The transistor 260 may be n-type or p-type. When the transistor 260 is n-type, the source feature 208S and the drain feature 208D may include silicon (Si) and an n-type dopant, such as phosphorus (P) or arsenic (As). When the transistor 260 is p-type, the source feature 208S and drain feature 208D may include silicon germanium (SiGe) and a p-type dopant, such as boron (B) or boron difluoride ($BF_2$). In one embodiment, the gate dielectric layer 204 may include hafnium oxide or other suitable high-k dielectric materials having a dielectric constant greater than that of silicon dioxide (~3.9). The gate electrode 206 may include a single layer or alternatively a multi-layer structure, such as various combinations of a metal fill layer and a plurality of work function metal layers. By way of example, the gate electrode 206 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. The gate dielectric layer 204 and the gate electrode 206 may be collectively referred to as a gate structure. The transistor 260 may be configured to serve as a logic device or a selection transistor for an OTP memory device. When the transistor 260 serves as a selection transistor for an OTP memory device, the gate electrode 206 is or is coupled to a word line (WL) and the source feature 208S is coupled to a source line (SL).

The workpiece 200 includes middle-end-of-line (MEOL) features to electrically connect the transistor to the interconnect structure 300. In the depicted embodiments, the transistor 260 in the workpiece 200 includes a source contact 210S over the source feature 208S, a drain contact 210D over the drain feature 208D, a source contact via 212S disposed on the source contact 210S, and a drain contact via 212D disposed on the drain contact 210D. Each of the source contact 210S, drain contact 210D, source contact via 212S, and the drain contact via 212D may include a metal fill layer formed of ruthenium (Ru), tungsten (W), cobalt (Co), nickel (Ni), copper (Cu), molybdenum (Mo). In some embodiments, each of the source contact 210S, drain contact 210D, source contact via 212S, and the drain contact via 212D may further include a barrier layer to prevent undesirable oxygen diffusion or electro-migration. When formed, the barrier layer may include titanium nitride or tantalum nitride. While not explicitly shown in the figures, the source contact 210S, drain contact 210D, source contact via 212S, and the drain contact via 212D are disposed in at least one interlayer dielectric (ILD) layer. The at least one ILD layer may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

The interconnect structure 300 is formed in the BEOL processes and is considered a BEOL structure. The interconnect structure 300 may include multiple interconnect layers. Each of the interconnect layers includes conductive lines and contact vias disposed in an intermetal dielectric (IMD) layer. The conductive lines and the contact vias may include aluminum (Al), tungsten (W), nickel (Ni), ruthenium (Ru), cobalt (Co), copper (Cu), or a combination thereof. The IMD layers may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silica glass (BSG), and/or other suitable dielectric materials. The dielectric materials for the ILD layers and the IMD layers are low-dielectric-constant (low-k) dielectric materials having dielectric constant smaller than that of silicon dioxide (~3.9). The low dielectric constants of the ILD layers and the IMD layers help lower parasitic capacitance among adjacent conductive features.

In some embodiments, a fully formed interconnect structure 300 may include about 8 and about 16 interconnect layers. In the embodiment depicted in FIG. 2, the interconnect structure 300 includes a first conductive line 214 over and in direct contact with the drain contact via 212D. The first conductive line 214 is in a bottommost interconnect layer of the interconnect structure 300. A second conductive line 220 is disposed over the first conductive line 214 and may be a conductive line in an intermediate interconnect layer that is above the bottommost interconnect layer but below the topmost interconnect layer of the interconnect structure. For example, when the interconnect structure 300 includes 10 interconnect layers, the second conductive line 220 may be any of the second interconnect layer, third interconnect layer, fourth interconnect layer, fifth interconnect layer, sixth interconnect layer, seventh interconnect layer, eighth interconnect layer, or ninth interconnect layer. The first conductive line 214 may be coupled to overlying interconnect layers by a first contact via 216. As shown in FIG. 2, the second conductive line 220 and other conductive lines in the same interconnect layer are disposed in a first IMD layer 218, which may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silica glass (BSG), and/or other suitable dielectric materials.

Conductive lines and contact vias in different interconnect layers may have different dimensions. In some instances, the first 4 or 5 interconnect layers closer to the FEOL structures may have smaller dimensions while the interconnect layers further above may have much larger dimensions. As will be described below, operations of method 100 is to be performed over the second conductive line 220 in an intermediate interconnect layer. It may be more economical if this intermediate interconnect layer is among those having larger conductive features because performing photolithography and etching processes to such higher layers requires less accuracy and has higher tolerance. Presence of other BEOL structures is another factor in determining in which interconnect layer method 100 is to be performed. Having a high density of BEOL structures in one interconnect layer may increase process difficulties and may reduce yield.

Figure 3:
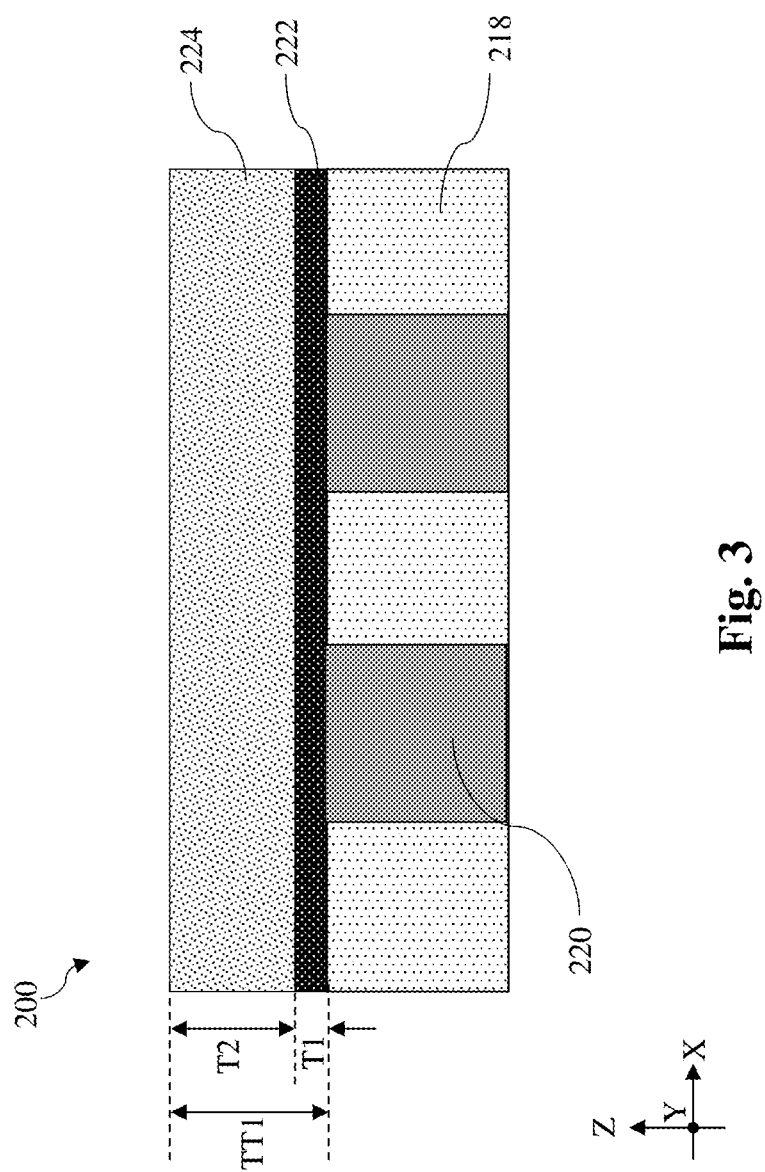

Referring to FIGS. 1, 2 and 3, method 100 includes a block 104 where a first etch stop layer (ESL) 222 and a second ESL 224 are deposited over the workpiece 200. A composition of the first ESL 222 is different from a composition of the second ESL 224. In some embodiments, the first ESL 222 may be a nitrogen-containing layer and the second ESL 224 is an oxygen containing layer. The second ESL 224 is disposed on the first ESL 222. The first ESL 222 may include silicon nitride, silicon oxycarbonitride or silicon carbonitride. The second ESL 224 may include silicon oxide. The dotted rectangular area in FIG. 2 is enlarged and illustrated in FIG. 3, which is also a fragmentary cross-sectional view of the workpiece 200. As shown in FIG. 3, a first total thickness Å of the first ESL 222 and the second ESL 224 along the Z direction may between about 50 nm and about 1000 nm. In the depicted embodiments, a second thickness T2 of the second ESL 224 is greater than a first thickness T1 of the first ESL 222 by between about 100 Å and about 150 Å such that the second ESL 224 may have a sufficient thickness to undergo a planarization process. In some instances, the second thickness T2 of the second ESL 224 may be between about 130 nm and about 400 nm. The first thickness T1 of the first ESL 222 may be between about 10 nm and about 100 nm. If the first thickness T1 is smaller than 10 nm, it may not provide sufficient etch rate difference signal to allow for etching end point detection. If the first thickness T1 is greater than 100 nm, breaking through the first ESL 222 may cause undesirable damages to the second ESL 224. A ratio of the second thickness T2 to the first thickness T1 may be between about 4 and about 15. At block 104, the first ESL 222 and the second ESL 224 may be deposited using chemical vapor deposition (CVD), plasma enhance CVD (PECVD), or atomic layer deposition (ALD). It is noted that depending on the processes, different interconnect layers may have different number of etch stop layer. While two etch stop layers are shown in FIG. 3, the present disclosure is not so limited and the workpiece 200 may include 3 or even 4 etch stop layers. Details of embodiments having more etch stop layers are omitted.

Figure 4:
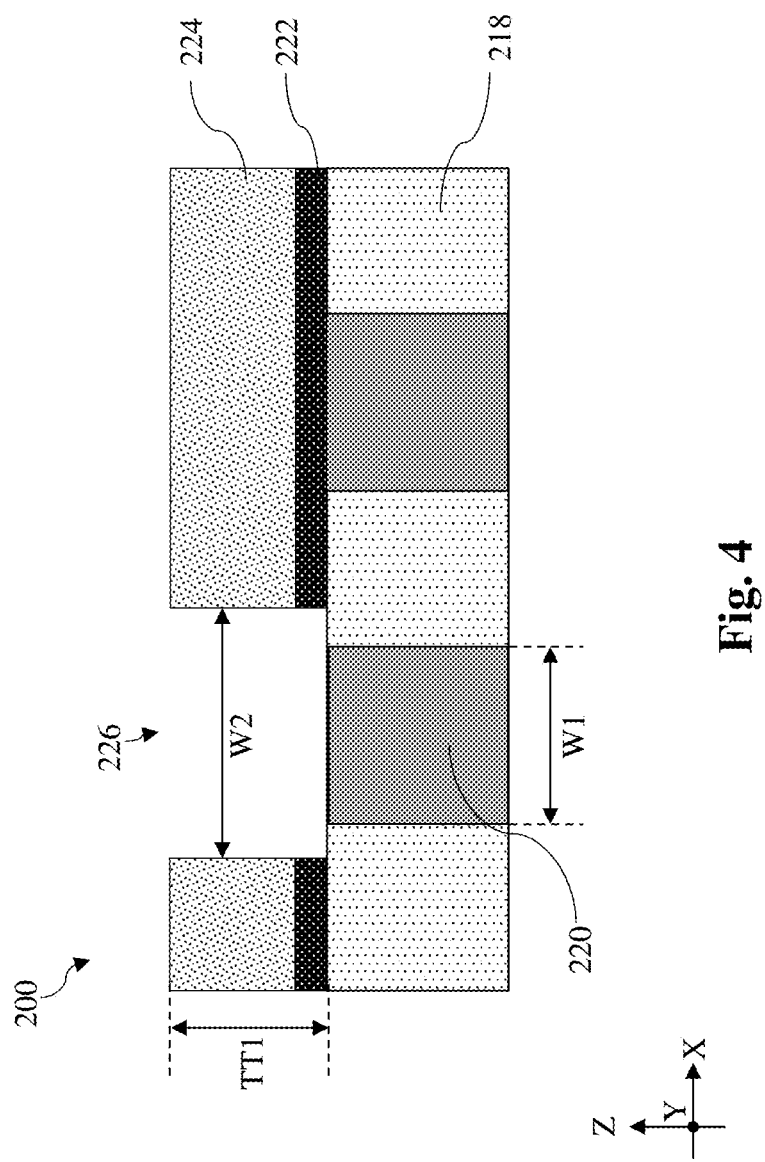

Referring to FIGS. 1 and 4, method 100 includes a block 106 where an opening 226 is formed in the workpiece 200 to expose the second conductive line 220. In an example process, a photoresist layer is deposited over the second ESL 224 using spin-on coating. After the deposition of the photoresist layer, photolithography processes and etch processes are performed to pattern the photoresist layer. The patterned photoresist layer is then used as an etch mask in etching the workpiece 200, including the second ESL 224 and the first ESL 222, to form the opening 226. At block 106, the first ESL 222 and the second ESL 224 may be anisotropically etched using a reactive-ion-etching (RIE) process that uses oxygen, hydrogen, a fluorine-containing gas (e.g., $CF_4$, $NF_3$, $SF_6$, $CH_2F_2$, $CHF_3$, and/or $C_2F_6$), a hydrocarbon (e.g. methane), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some implementations, the etch process at block 106 may be time-controlled to stop upon exposure of a portion of the second conductive line 220. Here, as will be described below, the exposed portion of the second conductive line 220 may be regarded as a bottom electrode. As shown in FIG. 4, the second conductive line 220 may have a first width W1 along the X direction and the opening 226 may have a second width W2 along the X direction. The second width W2 may be equal to, greater than, or smaller than the first width W1 to meet different breakdown voltage requirements of the to-be-formed OTP memory device. When everything else remains the same, larger second width W2 is likely to result in lower breakdown voltage because more defects may be present in larger area and defects may give rise to breakdown paths. Each of the first width W1 and the second width W2 may be between about 50 nm and about 500 nm.

Figure 5:
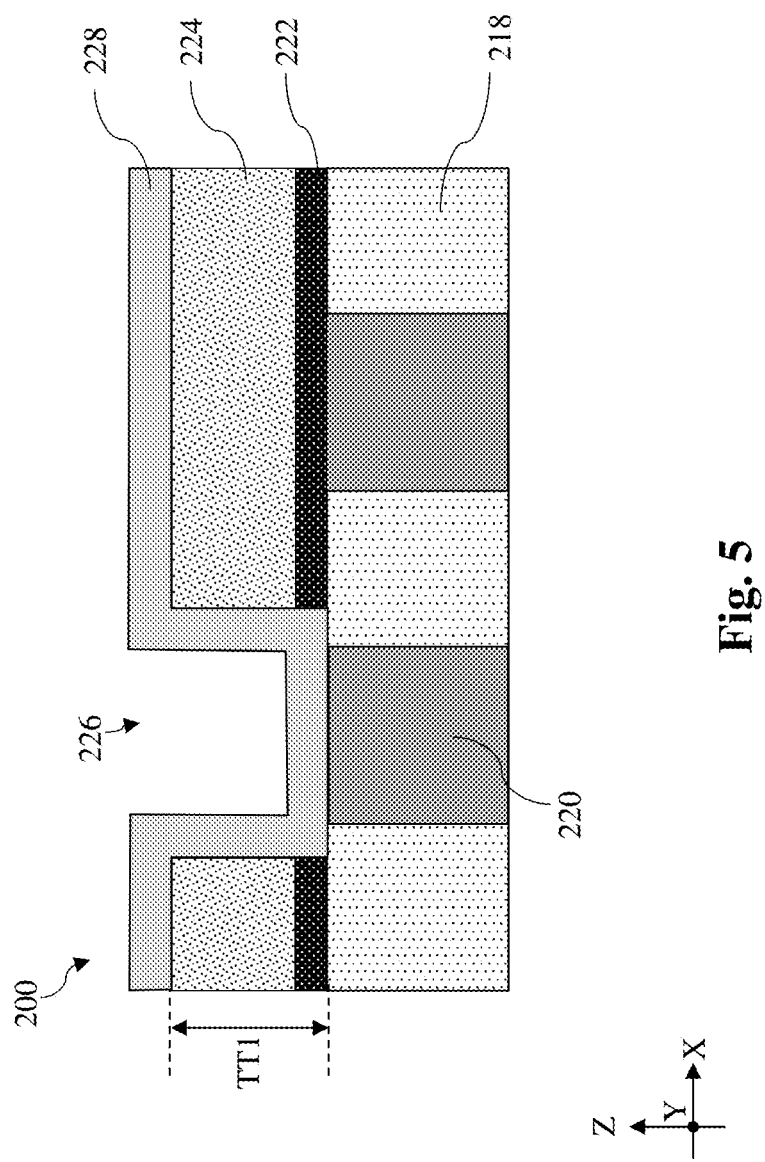

Referring to FIGS. 1 and 5, method 100 includes a block 108 where a breakdown layer 228 is deposited over the interconnect structure 300. The breakdown layer 228 includes a high-dielectric-constant (high-k) dielectric layer that has a dielectric constant greater than that of silicon dioxide (about 3.9). In some embodiments, the breakdown layer 228 may include hafnium oxide (HfO), aluminum oxide (AlO), aluminum nitride (AlN), titanium oxide (TiO), hafnium zirconium oxide (HfZrO), tantalum oxide (TaO), hafnium aluminum oxide (HfAlO), hafnium silicon oxide (HfSiO), zirconium oxide (ZrO), zirconium silicon oxide (ZrSiO), lanthanum oxide (LaO), yttrium oxide (YO), strontium titanium oxide (SrTiO), barium titanium oxide (BaTiO), barium zirconium oxide (BaZrO), hafnium lanthanum oxide (HfLaO), lanthanum silicon oxide (LaSiO), aluminum silicon oxide (AlSiO), hafnium tantalum oxide (HfTaO), hafnium titanium oxide (HfTiO). In one embodiment, the breakdown layer 228 may be formed of aluminum oxide (AlO), hafnium oxide (HfO), or aluminum nitride (AlN). The breakdown layer 228 may be deposited using ALD, PECVD, or CVD. Depending on the design, the breakdown layer 228 may have a thickness between about 10 Å and about 100 Å. Given the same quality of the breakdown layer 228 and a fixed area of the breakdown layer 228, the thickness of the breakdown layer 228 substantially determines the breakdown voltage of the OTP memory device it forms. For example, when the breakdown layer 228 has a thickness about 20 Å, the breakdown voltage of the breakdown layer 228 (or the OTP memory device it forms) is between about 1.5 V and about 2 V. When the breakdown layer 228 is thinner than 10 Å, the breakdown layer 228 may experience premature breakdown at a lower-than-design voltage. When the breakdown layer 228 is thicker than 100 Å, the breakdown voltage of the breakdown layer 228 may be higher than the highest operating voltage of the semiconductor device 200.

Figure 6:
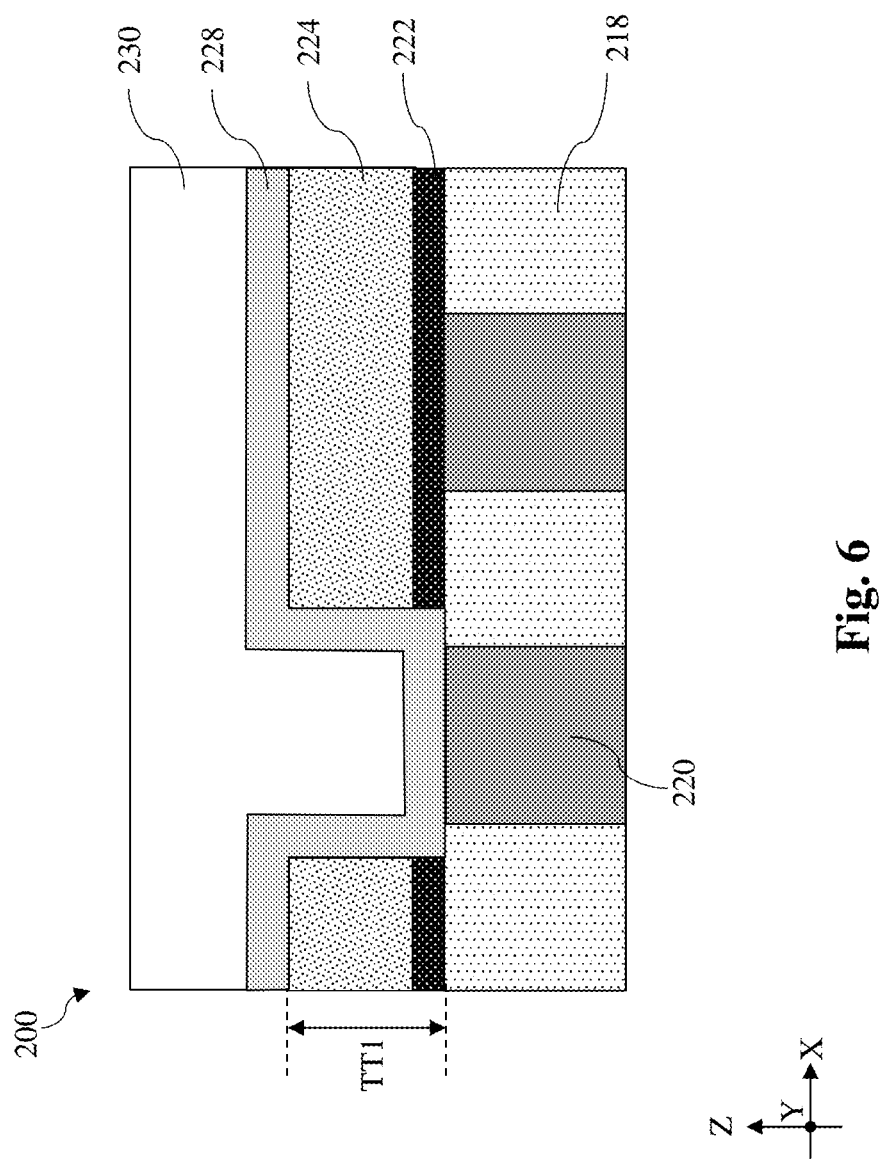

Referring to FIGS. 1 and 6, method 100 includes a block 110 where a top electrode layer 230 is deposited over the opening 226. The top electrode layer 230 may include a metal or a conductive metal nitride. In some embodiments, the top electrode layer 230 may include titanium nitride (TiN), tantalum nitride (TaN), tungsten (W), nickel (Ni), titanium (Ti), ruthenium (Ru), cobalt (Co), copper (Cu), other refractory metals, or other suitable metal materials or a combination thereof. The top electrode layer 230 may be deposited over breakdown layer 228 and the opening 226 by ALD, PVD, CVD, e-beam evaporation, or other suitable process. In some embodiments, the top electrode layer 230 may function as a resistive element of a high-resistance resistor. In those embodiments, the top electrode layer 230 may be formed of relatively less conductive material such as tantalum nitride (TaN) and a composition of the top electrode layer 230 is different from a composition of the second conductive line 220. Alternatively, when the top electrode layer 230 serves as a resistor element and is formed of a relatively more conductive material such as tungsten (W) or cobalt (Co), the opening 226 may have an elongated shape to have the desired resistance value.

Figure 7:
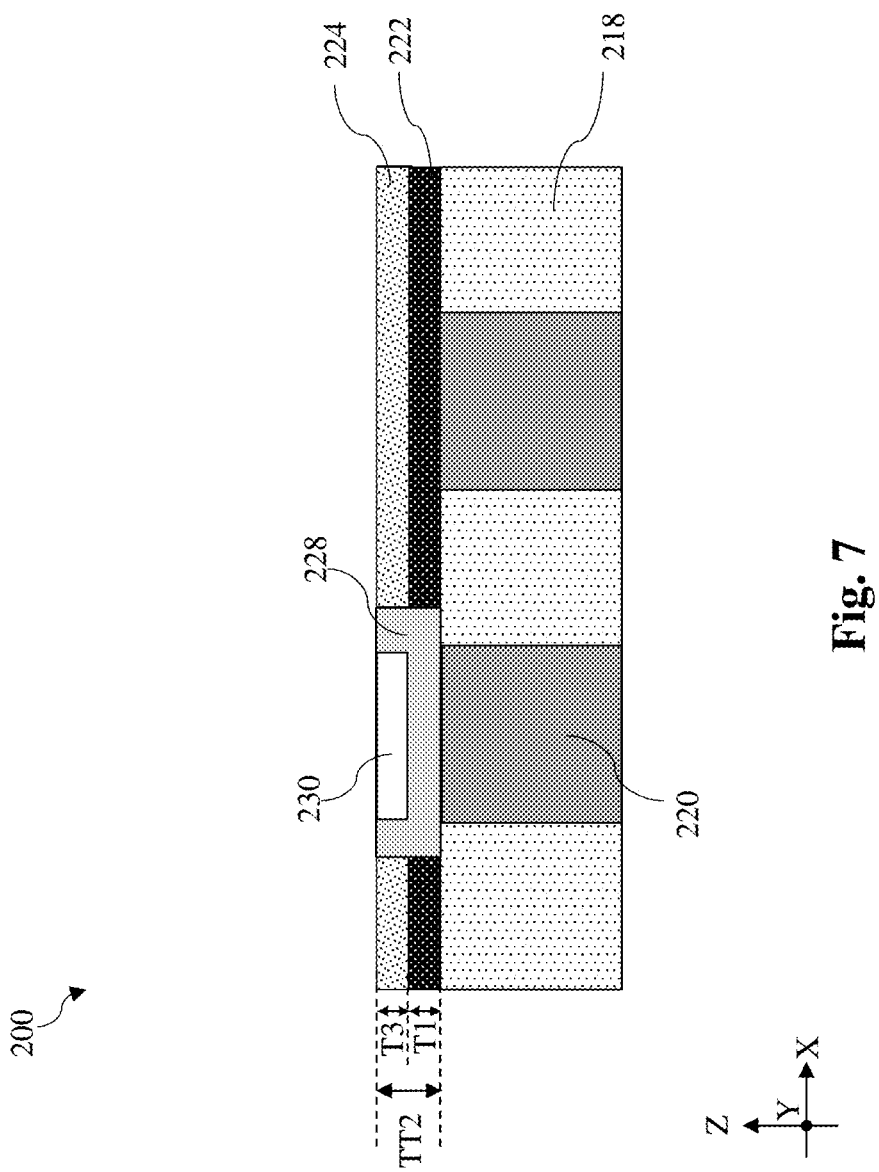

Referring to FIGS. 1 and 7, method 100 includes a block 112 wherein the workpiece 200 is planarized to form a top electrode 230. After the deposition of the top electrode layer 230, a planarization process, such as a CMP process, may be performed to remove excessive materials to provide a substantially planar top surface. As shown in FIG. 7, the planarization at block 112 is performed until all of the breakdown layer 228 and the top electrode layer 230 are removed from a top surface of the second ESL 224. In some implementations, the planarization at block 112 is also aimed to reduce the total thickness of the first ESL 222 and the second ESL 224 from the first total thickness TT1 shown in FIG. 3 to a smaller second total thickness TT2 shown in FIG. 7. Specifically, the planarization at block 112 reduces the second thickness T2 of the second ESL 224 to a third thickness T3, which may be between about 30 Å and about 200 Å. The first thickness T1, as described above, may be between about 10 Å and about 100 Å. In some instances, a ratio of the third thickness T3 to the first thickness T1 may be between about 1 and 3. The first thickness T1 represents the thickness of the breakdown layer 228 and substantially determines the breakdown voltage of the OTP memory device it forms. When the first thickness T1 is smaller than 10 Å, the breakdown layer 228 may experience premature breakdown at a lower-than-design voltage. When the first thickness T1 is greater than 100 Å, the breakdown voltage of the breakdown layer 228 may be higher than the highest operating voltage of the semiconductor device 200. In some instances, the second total thickness TT2 may be between about 50 nm and about 500 nm. That is, the planarization at block 112 is carried out to substantially reduce the total thickness of the first ESL 222 and the second ESL 224 by between about 100 Å and about 150 Å. The reduction of the total thickness of the first ESL 222 and the second ESL 224 prevents the interconnect layer (where the second conductive line 220 resides) from becoming too thick to be integrated into the interconnect structure 300. As shown in FIG. 7, the top electrode 230 is disposed in the breakdown layer 228, which has a U-shape when viewed along the Y direction. Sidewalls and a bottom surface of the top electrode 230 are surrounded by the breakdown layer 228 such that the top electrode 230 is spaced apart from the second ESL 224, the first ESL 222, the first IMD layer 218, and the second conductive line 220.

Figure 8:
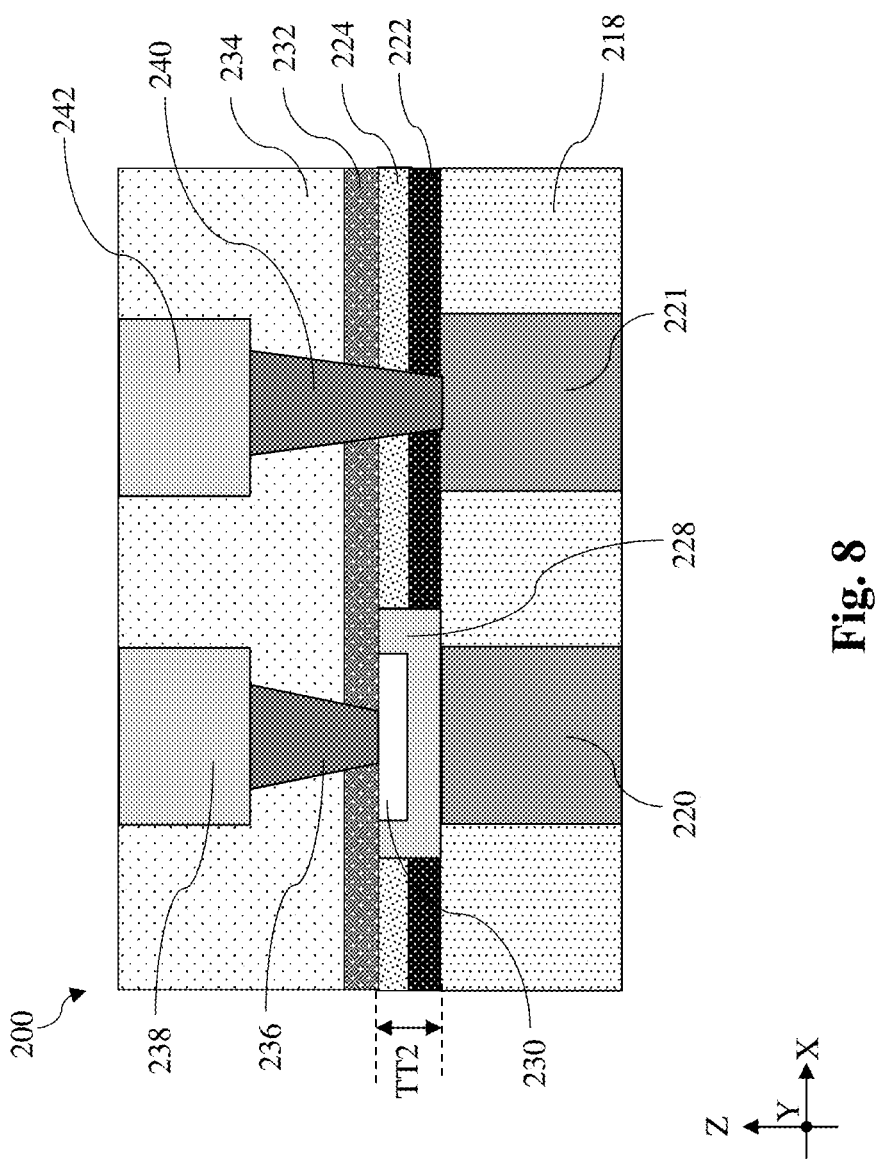

Referring to FIGS. 1 and 8, method 100 includes a block 114 where a third ESL 232 and a second IMD layer 234 are deposited over the workpiece 200. In some embodiments, the third ESL 232 may include a nitrogen-containing dielectric material, such as silicon nitride, silicon oxycarbonitride or silicon carbonitride. The second IMD layer 234 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The third ESL 232 may be deposited using ALD or CVD. The second IMD layer 234 may be deposited by spin-on coating, flowable CVD (FCVD), or other suitable deposition technique.

Referring still to FIGS. 1 and 8, method 100 includes a block 116 where an OTP contact via 236 is formed to couple to the top electrode 230 and a third conductive line 238 is formed to couple to the OTP contact via 236. In some embodiments, a dual damascene process may be used to form contact vias and conductive lines at block 116. In the depicted embodiments, an OTP contact via 236 is formed through the third ESL 232 and the second IMD layer 234 to couple to the top electrode 230, a third conductive line 238 is formed over the OTP contact via 236, a second contact via 240 is formed to couple to another conductive line 221 in the first IMD layer 218, and a fourth conductive line 242 is formed over the second contact via 240. In an example process, the second IMD layer 234 undergoes two patterning processes to form contact via openings and a trench over the contact via openings. A liner and a seed layer are then deposited in the contact via openings and the trench. In some instances, the liner may include titanium nitride and the seed layer may include titanium. Then a conductive material, such as aluminum (Al), tungsten (W), nickel (Ni), ruthenium (Ru), cobalt (Co), copper (Cu), is deposited in the contact via openings and the trench using electroplating. As shown in FIG. 8, the OTP contact vias 236 is in direct contact with the top electrode 230 and the third conductive line 238 is in direct contact with the OTP contact via 236. The second contact via 240 extends through the first ESL 222, the second ESL 224, the third ESL 232, and the second IMD layer 234 to couple to the another conductive line 221 in the first IMD layer 218. The fourth conductive line 242 is disposed on the second contact via 240. While the conductive lines and contact vias in the second IMD layer 234 may be of similar compositions, they are different in shapes, as shown in FIG. 8. It is noted that both the third conductive line 238 and the fourth conductive line 242 extend lengthwise along the Y direction. In embodiments depicted in FIG. 8, along the Z direction, a height of the second contact via 240 is greater than a height of the OTP contact via 236 by the second total thickness TT2.

Figure 9:
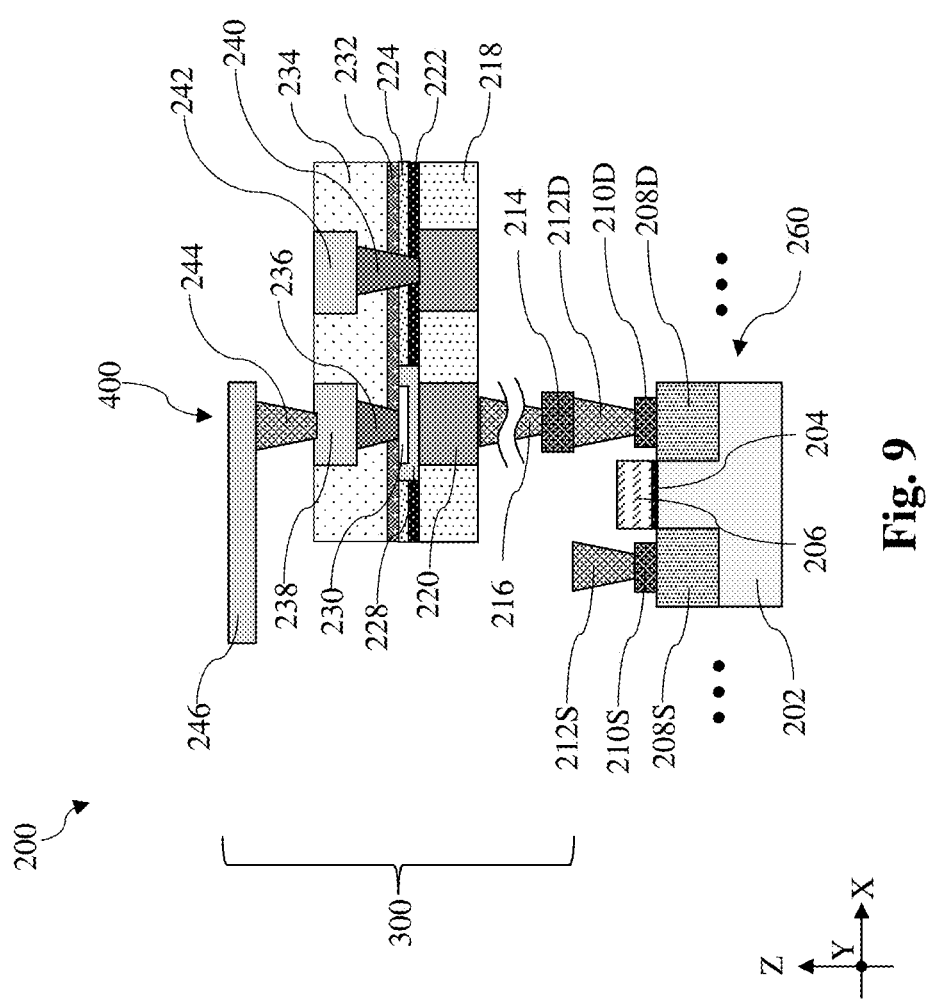

Referring still to FIGS. 1 and 9, method includes a block 118 where further processes are performed. Such further processes may include planarization of the workpiece 200 and formation of further interconnect layers over the dielectric layer 248. In the embodiments represented in FIG. 9, the further processes at block 118 may form a third contact via 244 over the third conductive line 238 and a fifth conductive line 246 is disposed over the third contact via 244. Like the OTP contact via 236 and the third conductive line 238, the third contact via 244 and the fifth conductive line 246 are disposed in an IMD layer (omitted) over the second IMD layer 234. In some embodiments, the fifth conductive line 246 may function as a bit line of an OTP memory device. The third contact via 244 and the fifth conductive line 246 are also part of the interconnect structure 300.

Upon conclusion of the operations at block 118, an OTP memory device 400 (or an OTP memory cell, or an OTP anti-fuse cell) is formed. As shown in FIG. 9, the OTP memory device 400 includes a fusible link, the gate electrode 206 serving as the word line, and the fifth conductive line 246 servicing as the bit line. The fusible link includes the second conductive line 220 (i.e., the bottom electrode), the breakdown layer 228, and the top electrode 230. When a voltage greater than a threshold voltage of the transistor 260 is applied at the gate electrode 206, the OTP memory device 400 is selected. When a high-resistance state is to be written, the voltage at the fifth conductive line 246 (i.e. bit line) is 0 V. Since voltage applied across the breakdown layer 228 is 0 V, the breakdown layer 228 remains intact with a high resistance. When a low resistance state is to be written, a breakdown voltage, such as 2V, is applied at the fifth conductive line 246 (i.e. bit line). The breakdown voltage may be controlled by an input/output (I/O) transistor. This high voltage will cause a breakdown of the breakdown layer 228, resulting in electrical communication between the top electrode 230 and the second conductive line 220 (i.e., the bottom electrode). One skilled in the art will realize that the high-resistance state or low-resistance state can be denoted as either state "0" or "1", depending on the design preference. In a read operation, a voltage is applied to the gate electrode 206 (i.e., word line) to turn on the transistor 260. A non-zero voltage lower than the breakdown voltage, such as 1.2 V, is applied to the fifth conductive line 246 (i.e. bit line). A voltage at the source line, which is coupled to the source contact via 212S, may be at 0V. When the OTP memory device 400 is in a high-resistance state, a low current is detected at the bit line. When the OTP memory device 400 is in a low-resistance state, a high current is detected at the bit line. The bit line current is thus used to determine the state of the OTP memory device 400.

Figure 10:
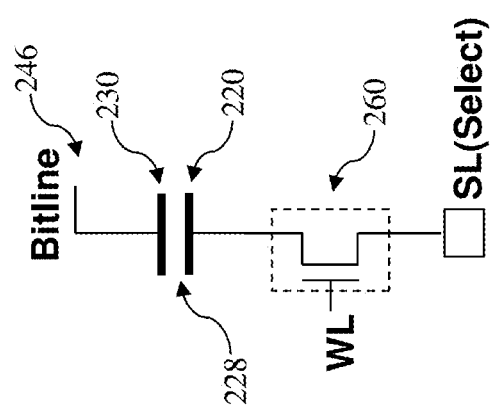
FIG. 10 is a circuit diagram representative of the semiconductor structure shown in FIG. 9.

Reference is made to FIG. 10, which is a circuit diagram representative of the semiconductor structure 200 shown in FIG. 9. The gate electrode 206 is coupled to the word line and controls the transistor 260. The source of the transistor 260 is coupled to the source line and the drain of the transistor 260 is coupled to fifth conductive line 246 by way of the fusible link. The fifth conductive line 246 serves as the bit line. The fusible link includes the second conductive line 246, which serves as a bottom electrode, the breakdown layer 228, and the top electrode 230.

Reference is now made to FIGS. 11, 12 and 13. In addition to the thickness of the breakdown layer 228, a vertical projection area of the breakdown layer 228 may impact the breakdown voltage of the breakdown layer 228. In some embodiments represented in FIG. 11, the opening 226 (shown in FIG. 4) is wider than the second conductive line 220 along in the X direction and the Y direction, the large area of the breakdown layer 228 is more likely to contain more defects that may give rise to breakdown paths through the breakdown layer 228. In some other embodiments represented in FIG. 12, the opening 226 (shown in FIG. 4) and the second conductive line 220 are of the same size and substantially overlap along the Z direction. Compared to the breakdown layer 228 in FIG. 11, the smaller area of the breakdown layer 228 in FIG. 12 is likely to have less defects, leading to higher breakdown voltage. In still other embodiments represented in FIG. 13, the opening 226 (shown in FIG. 4) is smaller than the second conductive line 220. Compared to the breakdown layer 228 in FIG. 12, the even smaller area of the breakdown layer 228 in FIG. 13 is likely to have even less defects, leading to even higher breakdown voltage. In all of embodiments represented in FIGS. 11, 12 and 13, the second conductive line 220 and the third conductive line 238 extend lengthwise along different directions. The second conductive line 220 extends lengthwise along the Y direction. The third conductive line 238 extends lengthwise along the X direction.

It is noted that in embodiments represented in FIGS. 11, 12 and 13, the top electrode 230 is disposed completely within the vertical projection area of the breakdown layer 228 to ensure that the breakdown takes place in the breakdown layer 228, not in other dielectric layers, such as the first ESL 222, the second ESL 224, or the first IMD layer 218. Otherwise, the breakdown voltage may be unpredictable as different dielectric materials lead to different breakdown voltages. That is, according to the present disclosure, an area of the electrode 230 on the X-Y plane is smaller than an area of the breakdown layer 228 on the X-Y plane. The difference of the X-Y-plane area of the breakdown layer 228 and the X-Y-plane area of the top electrode layer 230 depends on the overlay accuracy of the photolithography process. Higher overlay accuracy may require smaller area differences and lower overlay accuracy may require greater area differences. In some instances, an X-Y-plane area of the breakdown layer 228 surpasses an X-Y-plane area of the top electrode 230 by between about 20% and about 50%.

In some existing technologies, Hi-R resistors are formed in the interconnect structure while the fusible links of OTP memory devices are formed at the FEOL level. It follows that they are formed using very different processes, thereby increasing production cost and the number of photolithography steps. Forming the fusible links at the FEOL level may also increase the device dimension as they are formed alongside transistors, not vertically over the transistors. According to the present disclosure, method 100 described above may also be used to form a high-resistance (Hi-R) resistor. In fact, method 100 may be applied to form fusible links for OTP memory devices and Hi-R resistors simultaneously. When that happens, only one photomask may be needed to form fusible links for OTP memory devices and Hi-R resistors and the fusible links are disposed over transistors, not beside them. It is observed that moving the fusible links from the FEOL level to the BEOL level may reduce the device dimensions by between about 15% and about 25%.

Figure 14:
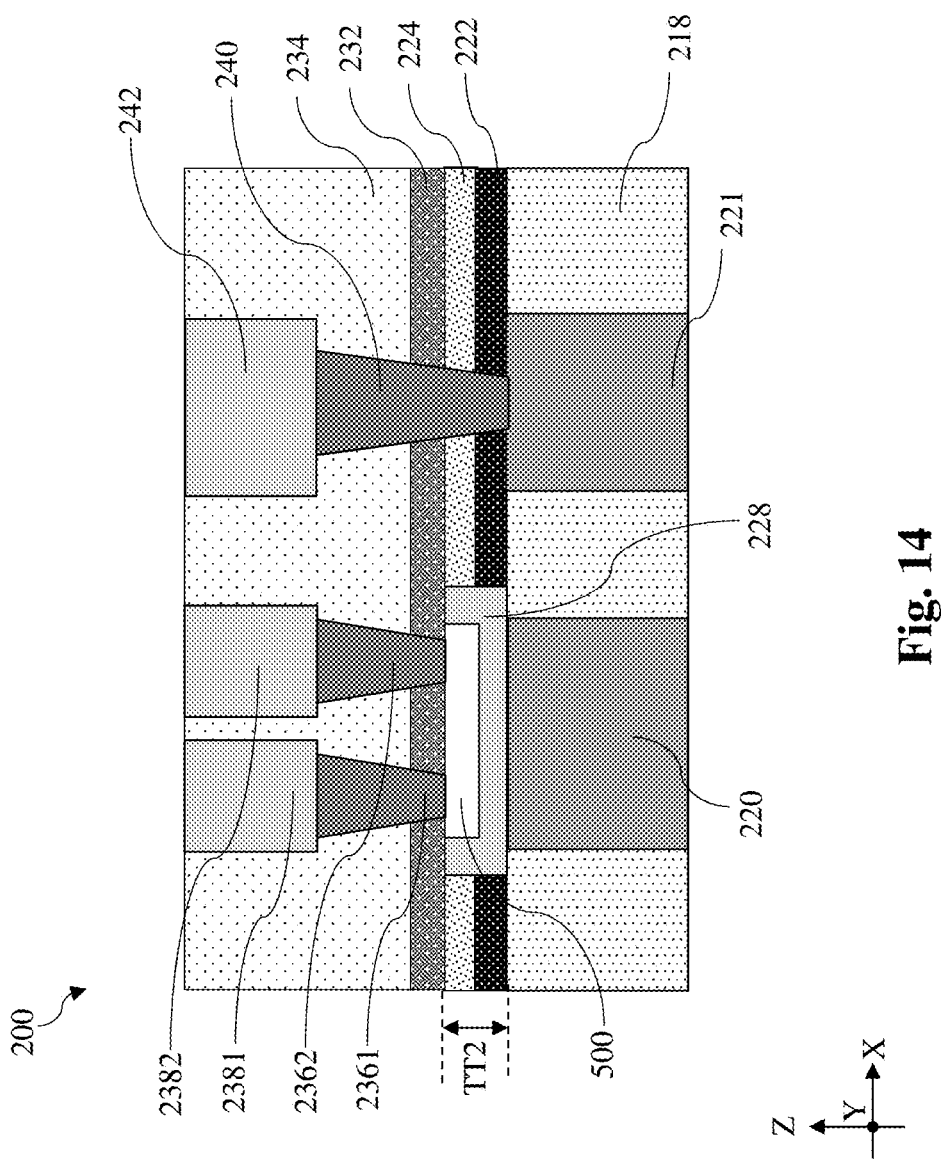
FIGS. 14-15 illustrate a diagrammatic fragmentary cross-sectional view of an alternative semiconductor structure fabricated using the method of FIG. 1, according to various aspects of the present disclosure.

An enlarged view of a Hi-R resistor 500 is shown in FIG. 14. The Hi-R resistor 500 in FIG. 14 is similar to the top electrode 230 shown in FIG. 8. The Hi-R resistor 500 is disposed over and surrounded by the U-shaped breakdown layer 228. The breakdown layer 228 is disposed on the second conductive line 220. In some embodiments where the breakdown layer 228 is wider than the second conductive line 220 along the X direction, the breakdown layer 228 is also in contact with the first IMD layer 218. The breakdown layer 228 is disposed in the first ESL 222 and the second ESL 224. The Hi-R resistor 500 is spaced apart from the first ESL 222, the second ESL 224, the first IMD layer 218, and the second conductive line 220 by the breakdown layer 228. Different from the structure in FIG. 8, multiple contact vias are disposed on and coupled to the Hi-R resistor 500. In the embodiments represented in FIG. 14, a first lead contact via 2361 and a second lead contact via 2362 are disposed on and resistively coupled to the Hi-R resistor 500. A first lead conductive line 2381 is disposed on and in contact with the first lead contact via 2361. A second lead conductive line 2382 is disposed on and in contact with the second lead contact via 2362. The first lead contact via 2361 and the second lead contact via 2362 extend through the third ESL 232 and the second IMD layer 234. The first lead conductive line 2381 and the second lead conductive line 2382 are disposed in the second IMD layer 234. The first ESL 222 and the second ESL 224 have the second total thickness TT2.

Figure 15:
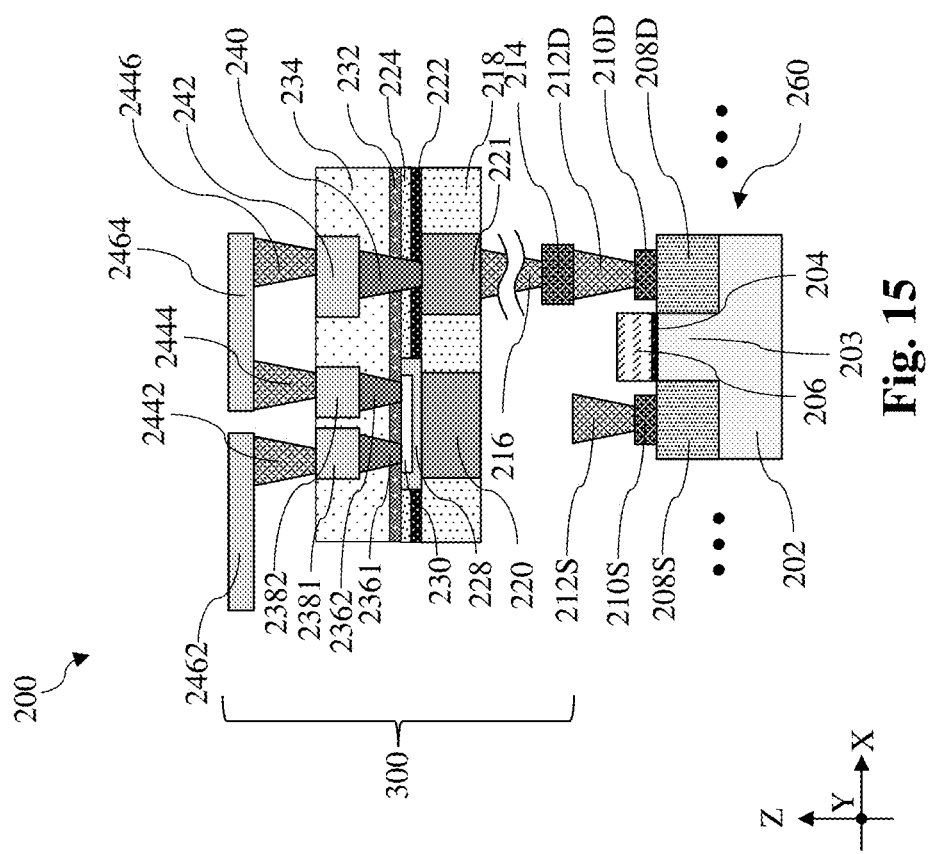

FIG. 15 illustrates a workpiece 200 where the Hi-R resistor 500 is situated in an interconnect structure 300 disposed over a transistor 260. In the embodiments represented in FIG. 15, the first lead conductive line 2381 is electrically coupled to a sixth conductive line 2462 by a fourth contact via 2442 and the second lead conductive line 2382 is electrically coupled to a seventh conductive line 2464 by a fifth contact via 2444. The seventh conductive line 2464 is electrically coupled to the drain contact via 212D by way of all the contact vias and conductive lines in between, including a contact via 2446, the fourth conductive line 242, the second contact via 240, a conductive line 221, the first contact via 216, and the first conductive line 214.

Reference is again made to FIG. 14. When in use, current passes from one of the first lead contact via 2361 and the second lead contact via 2362 to the other of the first lead contact via 2361 and the second lead contact via 2362 by way of the Hi-R resistor 500. Like the top electrode 230, the Hi-R resistor 500 may include titanium nitride (TiN), tantalum nitride (TaN), tungsten (W), nickel (Ni), titanium (Ti), ruthenium (Ru), cobalt (Co), copper (Cu), other refractory metals, or other suitable metal materials or a combination thereof. In some embodiments, Hi-R resistor 500 may be formed of relatively less conductive material such as tantalum nitride (TaN). In some other embodiments where Hi-R resistor 500 is formed of a relatively more conductive material such as copper (Cu) or tungsten (W), the X-direction dimension of the Hi-R resistor 500 may be enlarged such that contact points of the first lead contact via 2361 and the second lead contact via 2362 may be disposed further apart to increase the resistance.

In some implementations, the effective resistance of the Hi-R resistor 500 may be adjusted by increasing the number of lead contact vias or varying the distance between the lead contact vias. Reference is now made to FIGS. 16-19. In embodiments represented in FIG. 16, each of the first lead conductive line 2381 and the second lead conductive line 2382 is respectively coupled to the Hi-R resistor 500 by one lead contact via (the first lead contact via 2361 or the second lead contact via 2362). To ensure satisfactory via-line contact, each of the first lead contact via 2361 and the second lead contact via 2362 may have a rectangular or an elongated shape. As shown in FIG. 16, the first lead contact via 2361 may have a via width (VW) along the X direction and a via length (VL) along the Y direction, wherein the via length (VL) is greater than the via width (VW). In some instances, the via width (VW) may be between about 25 nm and about 50 nm and the via length (VL) may be between about 80 nm and about 120 nm. The first lead conductive line 2381 or the second lead conductive line 2382 may have a line width (LW) along the Y direction and the line width (LW) may be between about 100 nm and about 200 nm. That way, the first lead contact via 2361 intersects the line width (LW) of the first lead conductive line 2381 with its longer via length (VL), rather than the shorter via width (VW). In some implementations, the line width (LW) may be substantially identical to the via length (VL) such that the line width (LW) and the via length (VL) are substantially coterminous.

To ensure that the first lead contact via 2361 and the second lead contact via 2362 land on the Hi-R resistor 500, each edge of the first lead contact via 2361 and the second lead contact via 2362 is spaced apart from a boundary of the Hi-R resistor 500 by a margin (M). The margin (M) is directly related to the accuracy and resolution of the photolithography processes. For example, when the photolithography process implements a radiation source having a wavelength around 248 nm, the margin (M) may be equal to or greater than about 30 nm. If the margin (M) is smaller than about 30 nm, occurrence of defects associated with misalignment of lead contact vias may be unsatisfactory. The margin (M) should be smaller than about 100 nm or the Hi-R resistor 500 may be too large to be enclosed in the breakdown layer 228. When a different radiation source with a smaller wavelength is used, the margin (M) may have a smaller range. For example, when the wavelength of the radiation source is about 193 nm, the margin (M) may be between 20 nm and about 60 nm. The margin (M) may also be characterized using a ratio of the margin (M) to the via length (VL). In some instances, the ratio (M/VL) may be between about 0.2 and about 0.3. When the ratio (M/VL) is smaller than 0.2, the probability for the lead contact via to land outside the Hi-R resistor 500 is unsatisfactory. When the ratio (M/VL) is greater than 1.3, the packing density of the lead vias may be too low, resulting in unnecessary increase of device dimensions. To achieve the desired effective resistance using the Hi-R resistor 500, a Y-direction spacing (S) between the first lead contact via 2361 and the second lead contact via 2362 may be between about 100 nm and about 12 µm. When the Y-direction spacing (S) is smaller than about 100 nm, the resistance may not reach the desired level. When the Y-direction spacing (S) is greater than about 12 µm, it may become difficult to fit the Hi-R resistor 500 in the interconnect layer it resides.

To maximize the via-to-via distance (D) while maintaining a given Y-direction spacing (S), the first lead contact via 2361 and the second lead contact via 2362 may be arranged to land on diagonal corners of the top electrode 230, as illustrated in FIG. 17. In some instances, the via-to-via distance (D) may be between about 1.2 times to about 3 times of the Y direction spacing (S). That is, a ratio of the via-to-via distance (D) to the Y-direction spacing (S) may be between about 1.2 and 3. It is noted, however, when this ratio (D/S) is smaller than 1.2 or greater than 1.6, the diagonal via placement may not result in substantial absolute space savings because doing so merely changes the lengthwise orientation of the Hi-R resistor 500. Because the via-to-via distance (D) is directly related to the effective resistance, the embodiments represented in FIG. 17 provides flexibility in accommodating top electrodes 230 of different orientations. For example, depending on the layout in the interconnect layer the Hi-R resistor 500 resides, the Hi-R resistor 500 may have a shape that is elongated along the X direction, rather than along the Y direction as shown in FIG. 17.

Figure 19:
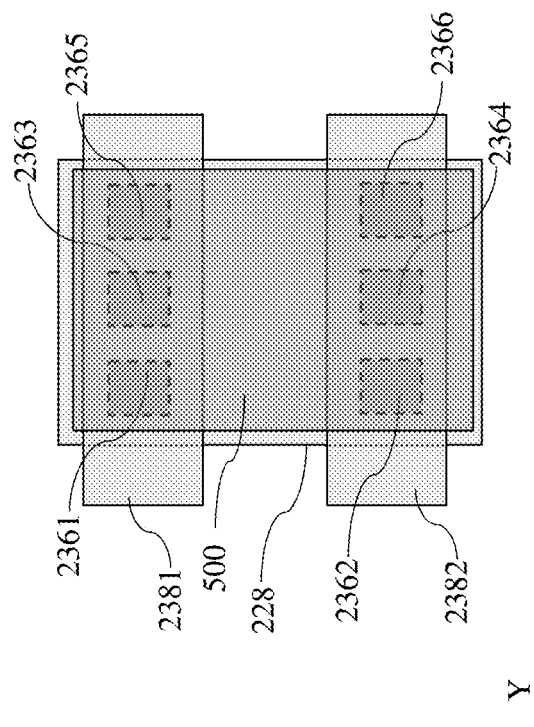
Figure 18:
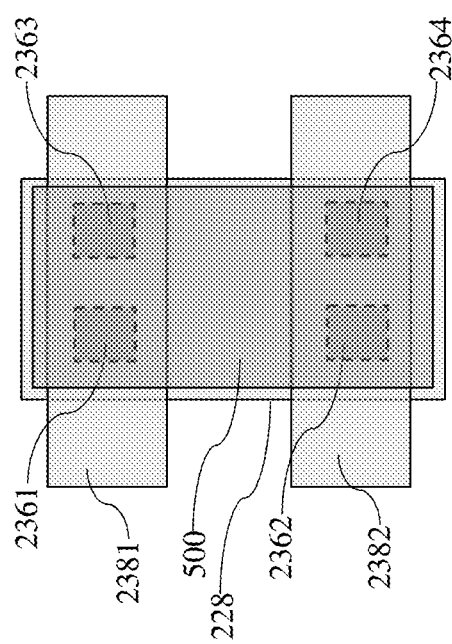

When one half (½) of the effective resistance of the Hi-R resistor 500 in FIG. 16 is desired, each of the first lead conductive line 2381 and the second lead conductive line 2382 is respectively coupled to the Hi-R resistor 500 by two lead contact vias, as shown in FIG. 18. In FIG. 18, the first lead conductive line 2381 is coupled to the Hi-R resistor 500 by the first lead contact via 2361 and a third lead contact via 2363; and the second lead conductive line 2382 is coupled to the Hi-R resistor 500 by the second lead contact via 2362 and a fourth lead contact via 2364. If one third (⅓) of the effective resistance of the Hi-R resistor 500 in FIG. 16 is desired, each of the first lead conductive line 2381 and the second lead conductive line 2382 is respectively coupled to the Hi-R resistor 500 by three lead contact vias, as shown in FIG. 19. In FIG. 19, the first lead conductive line 2381 is coupled to the Hi-R resistor 500 by the first lead contact via 2361, the third lead contact via 2363 and a fifth lead contact via 2365; and the second lead conductive line 2382 is coupled to the Hi-R resistor 500 by the second lead contact via 2362, the fourth lead contact via 2364, and a sixth lead contact via 2366. It can be understood that more lead contact vias may be implemented to lower the resistance of the Hi-R resistor 500 even further. Examples shown in FIGS. 16-19 demonstrate that method 100 of the present disclosure may be used to form Hi-R resistors having different effective resistance.

Figure 20:
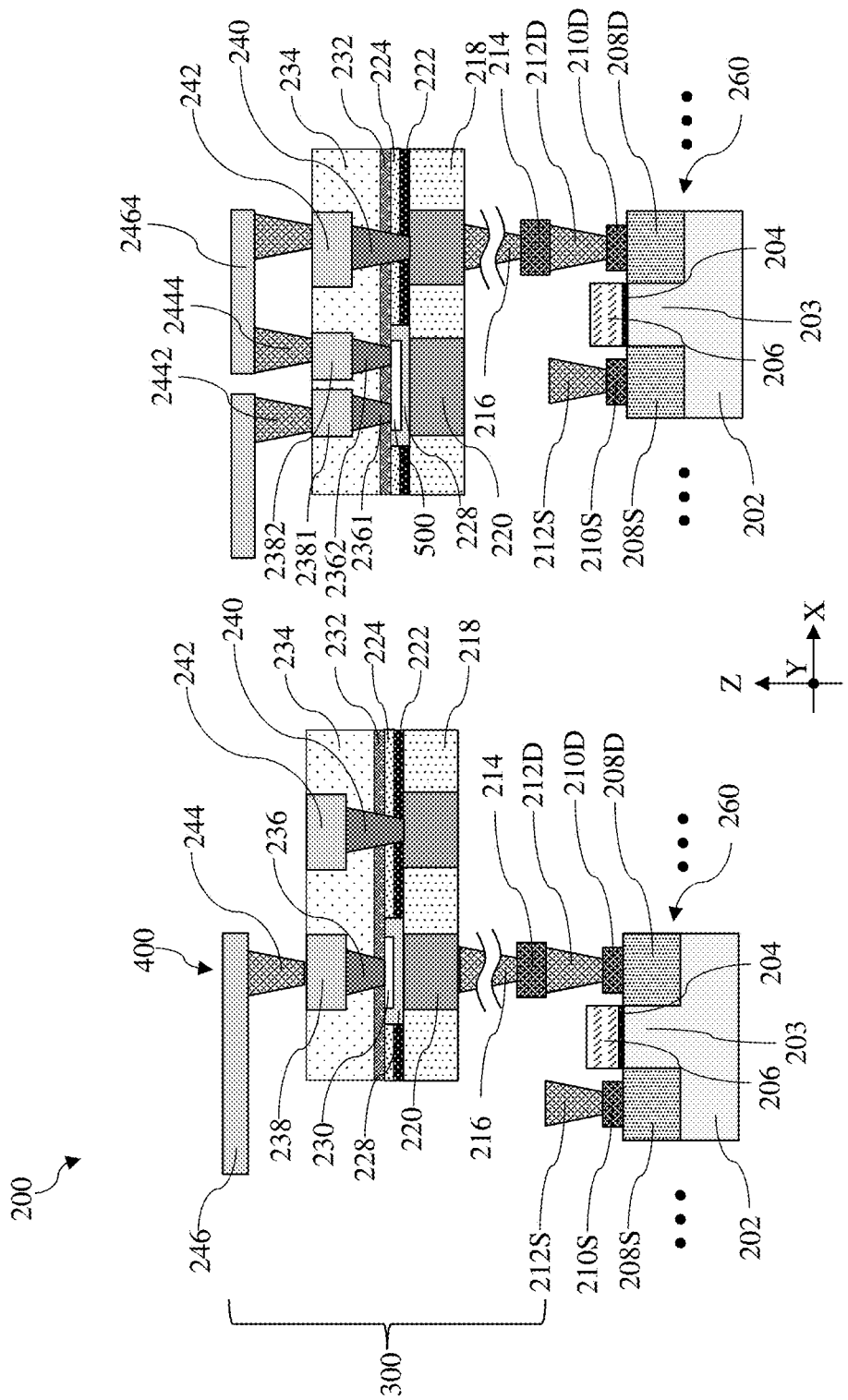
FIG. 20 illustrates a semiconductor structure that includes both an OTP memory device and a high-resistance (Hi-R) device, according to various aspects of the present disclosure.

FIG. 20 illustrates that the workpiece 200 shown in FIG. 9 and the workpiece 200 shown in FIG. 15 may well be a single workpiece 200 that includes both the Hi-R resistor 500 and the OTP memory device 400. Detailed descriptions of FIG. 20 are omitted for brevity. It is noted that, throughout the present disclosure, like reference numerals denote like features.

Embodiments of the present disclosure provide benefits. Methods of the present disclosure may simultaneously form a high-resistance (Hi-R) resistor and an OTP memory device in an BEOL interconnect structure. Forming these two types of devices together in the BEOL interconnect structure may lower the manufacturing cost due to a smaller number of photomasks and reduce device dimensions. The present disclosure also provides mechanisms or structures to adjust the effective resistance of the high-resistance resistor or the breakdown voltage of the OTP memory device.

Thus, in one aspect, the present disclosure provides a semiconductor structure. The semiconductor structure includes a transistor and an interconnect structure disposed over the transistor. The interconnect structure includes a first dielectric layer, a first conductive feature in the first dielectric layer, a first etch stop layer (ESL) disposed over the first dielectric layer and the first conductive feature, a dielectric feature disposed in the first ESL, an electrode disposed over the dielectric feature, and a second ESL disposed on the first ESL and the electrode.

In some embodiments, the dielectric feature includes aluminum oxide, hafnium oxide, or aluminum nitride. In some instances, the electrode includes titanium nitride, tantalum nitride, copper, tungsten, cobalt, or ruthenium. In some implementations, the dielectric feature includes a thickness between about 10 Å and about 100 Å. In some embodiments, the interconnect structure further includes a third ESL disposed between the first ESL and the first dielectric layer and the dielectric feature is also disposed in the third ESL. In some embodiments, a composition of the third ESL is different from a composition of the second ESL. In some instances, the dielectric feature is in direct contact with the first ESL, the third ESL, the second ESL, and the first conductive feature. In some embodiments, the electrode is spaced apart from the first ESL, the third ESL, and the first conductive feature by the dielectric feature. In some embodiments, a width of the dielectric feature is greater than a width of the first conductive feature, the dielectric feature is further in contact with the first dielectric layer, and the electrode is spaced apart from the first dielectric layer by the dielectric feature. In some instances, the interconnect structure further includes a second dielectric layer disposed on the second ESL, a contact via disposed in the second ESL and the second dielectric layer and coupled to the electrode, and a second conductive feature disposed in the second dielectric layer and coupled to the contact via. In some instances, a drain of the transistor is electrically coupled to the first conductive feature.

Another aspect of the present disclosure involves an image sensor. The image sensor includes a transistor, an interlayer dielectric (ILD) layer disposed over the transistor, a first conductive feature in the ILD layer, a first etch stop layer (ESL) disposed over the ILD layer and the first conductive feature, a high-k dielectric feature disposed in the first ESL, a metal feature disposed over the high-k dielectric feature, and a second ESL disposed on the first ESL and the metal feature.

In some embodiments, a composition of the metal feature is different from a composition of the first conductive feature. In some instances, the semiconductor structure may further include a second ILD layer disposed on the second ESL, a first contact via disposed in the second ESL and the second ILD layer and coupled to the metal feature, a second contact via disposed in the second ESL and the second ILD layer and coupled to the metal feature, a second conductive feature disposed in the second ILD layer and coupled to the first contact via, and a third conductive feature disposed in the second ILD layer and coupled to the first contact via. In some implementations, the first contact via is resistively coupled to the second contact via by way of the metal feature. In some embodiments, a drain of the transistor is electrically coupled to the second conductive feature.

Yet another aspect of the present disclosure involves a method. The method includes receiving a workpiece including a transistor, an interlayer dielectric (ILD) layer disposed over the transistor, a first conductive feature in the ILD layer, a first etch stop layer (ESL) disposed over the ILD layer and the first conductive feature, a second ESL disposed on the first ESL. The method further includes forming an opening through the second ESL and the first ESL to expose the first conductive feature, depositing a high-k dielectric layer over the opening, depositing a metal layer over the high-k dielectric layer, planarizing the workpiece to remove the high-k dielectric layer and the metal layer over a top surface of the second ESL, and after the planarizing, forming a contact via to couple to a top surface of the metal layer.

In some embodiments, the first conductive feature includes a first width along a direction, the opening includes a second width along the direction, and the second width is greater than the first width. In some instances, the depositing of the high-k dielectric layer includes depositing aluminum oxide, hafnium oxide, zirconium oxide, titanium oxide, zinc oxide, yttrium oxide, tantalum oxide, or aluminum nitride over the opening. In some implementations, the depositing of the metal layer includes depositing titanium nitride, tantalum nitride, copper, tungsten, cobalt, or ruthenium.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor structure, comprising:
a transistor; and
an interconnect structure disposed over the transistor, wherein the interconnect structure comprises:
a first dielectric layer,
a first conductive feature in the first dielectric layer,
a first etch stop layer (ESL) disposed on a top surface of the first dielectric layer,
a dielectric feature disposed in the first ESL and in contact with a top surface of the first conductive feature and the top surface of the first dielectric layer,
an electrode disposed over the dielectric feature such that the electrode is vertically spaced apart from the top surface of the first conductive feature by the dielectric feature, and
a second ESL disposed on and in contact with top surfaces of the dielectric feature and the electrode.

2. The semiconductor structure of claim 1, wherein the dielectric feature comprises aluminum oxide, hafnium oxide, or aluminum nitride.

3. The semiconductor structure of claim 1, wherein the electrode comprises titanium nitride, tantalum nitride, copper, tungsten, cobalt, or ruthenium.

4. The semiconductor structure of claim 1, wherein the dielectric feature comprises a thickness between about 10 Å and about 100 Å.

5. The semiconductor structure of claim 1,
wherein the interconnect structure further comprises a third ESL disposed between the first ESL and the first dielectric layer,
wherein the dielectric feature is also disposed in the third ESL.

6. The semiconductor structure of claim 5, wherein a composition of the third ESL is different from a composition of the second ESL.

7. The semiconductor structure of claim 5, wherein the dielectric feature is in direct contact with the first ESL, the third ESL, the second ESL, and the first conductive feature.

8. The semiconductor structure of claim 5, wherein the electrode is spaced apart from the first ESL, the third ESL, and the first conductive feature by the dielectric feature.

9. The semiconductor structure of claim 5,
wherein a width of the dielectric feature is greater than a width of the first conductive feature,
wherein the dielectric feature is further in contact with the first dielectric layer,
wherein the electrode is spaced apart from the first dielectric layer by the dielectric feature.

10. The semiconductor structure of claim 1, wherein the interconnect structure further comprises:
a second dielectric layer disposed on the second ESL;
a contact via disposed in the second ESL and the second dielectric layer and coupled to the electrode; and
a second conductive feature disposed in the second dielectric layer and coupled to the contact via.

11. The semiconductor structure of claim 1, wherein a drain of the transistor is electrically coupled to the first conductive feature.

12. A semiconductor structure, comprising:
a transistor;
an interlayer dielectric (ILD) layer disposed over the transistor;
a first conductive feature in the ILD layer;
a first etch stop layer (ESL) disposed on a top surface of the ILD layer;
a high-k dielectric feature extending through the first ESL to be in contact with a top surface of the first conductive feature;
a metal feature disposed over the high-k dielectric feature such that the metal feature is vertically spaced apart from the top surface of the first conductive feature by the high-k dielectric feature; and
a second ESL disposed the metal feature and the high-k dielectric feature,
wherein top surfaces of the metal feature and the high-k dielectric feature are coplanar.

13. The semiconductor structure of claim 12, wherein a composition of the metal feature is different from a composition of the first conductive feature.

14. The semiconductor structure of claim 12, further comprising:
a second ILD layer disposed on the second ESL;
a first contact via disposed in the second ESL and the second ILD layer and coupled to the metal feature;
a second contact via disposed in the second ESL and the second ILD layer and coupled to the metal feature;
a second conductive feature disposed in the second ILD layer and coupled to the first contact via; and
a third conductive feature disposed in the second ILD layer and coupled to the first contact via.

15. The semiconductor structure of claim 14, wherein the first contact via is resistively coupled to the second contact via by way of the metal feature.

16. The semiconductor structure of claim 14, wherein a drain of the transistor is electrically coupled to the second conductive feature.

17. A semiconductor structure, comprising:
a dielectric layer including a top surface;
a first conductive feature in the dielectric layer and having a top surface coplanar with the top surface of the dielectric layer;
a first etch stop layer (ESL) disposed over the top surface of the dielectric layer;
a second ESL disposed on the first ESL;
a high-k dielectric layer extending through the first ESL and the second ESL to come in contact with the top surface of the first conductive feature and the top surface of the dielectric layer; and
a second conductive feature disposed over the high-k dielectric layer,
wherein the second conductive feature is spaced apart from the first ESL, the second ESL, the first conductive feature and the dielectric layer by the high-k dielectric layer.

18. The semiconductor structure of claim 17, wherein a top surface of the second conductive feature and a top surface of the second ESL are coplanar.

19. The semiconductor structure of claim 17,
wherein the first conductive feature comprises aluminum (Al), tungsten (W), nickel (Ni), ruthenium (Ru), cobalt (Co), or copper (Cu),
wherein the second conductive feature comprises tantalum nitride (TaN).

20. The semiconductor structure of claim 17, wherein the high-k dielectric layer comprises hafnium oxide (HfO), aluminum oxide (AlO), aluminum nitride (AlN), titanium oxide (TiO), hafnium zirconium oxide (HfZrO), tantalum oxide (TaO), hafnium aluminum oxide (HfAlO), hafnium silicon oxide (HfSiO), zirconium oxide (ZrO), zirconium silicon oxide (ZrSiO), lanthanum oxide (LaO), yttrium oxide (YO), strontium titanium oxide (SrTiO), barium titanium oxide (BaTiO), barium zirconium oxide (BaZrO), hafnium lanthanum oxide (HfLaO), lanthanum silicon oxide (LaSiO), aluminum silicon oxide (AlSiO), hafnium tantalum oxide (HfTaO), hafnium titanium oxide (HfTiO).

* * * * *